US008975929B2

(12) United States Patent
Kumar

(10) Patent No.: US 8,975,929 B2
(45) Date of Patent: Mar. 10, 2015

(54) HIGH VOLTAGE TOLERANT INPUT BUFFER

(71) Applicant: STMicroelectronics International N.V., Amsterdam (NL)

(72) Inventor: Surendra Kumar, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/922,483

(22) Filed: Jun. 20, 2013

(65) Prior Publication Data

US 2014/0375358 A1 Dec. 25, 2014

(51) Int. Cl.
*H03B 1/00* (2006.01)
*H03K 19/0175* (2006.01)

(52) U.S. Cl.
CPC .............................. *H03K 19/017509* (2013.01)
USPC ........................... 327/108; 327/112; 327/318

(58) Field of Classification Search
USPC ......... 327/108–112, 318, 320, 389, 391, 427; 326/26, 27, 83
See application file for complete search history.

(56) References Cited

U.S. PATENT DOCUMENTS

| 5,473,271 | A | * | 12/1995 | Little et al. ..................... 327/108 |
| 5,548,240 | A | * | 8/1996 | Bayer ............................ 327/108 |
| 5,568,081 | A | * | 10/1996 | Lui et al. ........................ 327/108 |
| 6,545,515 | B2 | * | 4/2003 | Takahashi et al. ............ 327/110 |
| 7,164,305 | B2 | | 1/2007 | Gupta et al. |
| 7,495,483 | B2 | | 2/2009 | Kumar et al. |
| 7,521,970 | B2 | | 4/2009 | Gupta et al. |
| 8,258,821 | B2 | | 9/2012 | Dina et al. |

* cited by examiner

*Primary Examiner* — Long Nguyen
(74) *Attorney, Agent, or Firm* — Gardere Wynne Sewell LLP

(57) ABSTRACT

A circuit includes a first input transistor and a first voltage divider coupled to a source of the first input transistor and a second input transistor and a second voltage divider coupled to a source of the second input transistor. A first set of series connected transistors include a first transistor with a gate coupled to the first input transistor source and a second transistor with a gate coupled to a tap of the first voltage divider. A second set of series connected transistors include a third transistor with a gate coupled to the second input transistor source and a fourth transistor with a gate coupled to a tap of the second voltage divider. An output is coupled to the sources of the first and second input transistors. The first and second sets are coupled to one of the first input transistor drain or second input transistor drain.

28 Claims, 3 Drawing Sheets

HIGH VOLTAGE TOLERANT INPUT BUFFER

TECHNICAL FIELD

The present invention relates to input buffer circuits and, in particular, to an input buffer circuit powered from a lower voltage supply and tolerant of higher voltage supply referenced input signals.

BACKGROUND

Reference is now made to FIG. 1 which illustrates a circuit diagram of a prior art high voltage tolerant input buffer circuit 10. An input node 12 is configured to receive an input signal (IN) referenced to a relatively higher supply voltage. For example, the input signal may be referenced to a higher supply voltage of 5V, and may comprise a digital signal wherein the input signal is at 5V to represent a logic high data value and is at 0V to represent a logic low data value. The circuit 10, however, is powered from a relatively lower supply voltage (VDD). For example, the relatively lower supply voltage VDD may comprise 3.3V, 2.5V or 1.8V. Such a situation commonly occurs when interfacing an integrated circuit chip powered from the relatively lower supply voltage to receive input signals referenced to the relatively higher supply voltage.

A pair of series connected p-channel transistors 14 and 16 is coupled between a supply node 18 (configured to receive the relatively lower supply voltage VDD) and a ground reference node 20. The transistor 14 has a source terminal coupled to the supply node 18 and a drain terminal coupled to a control node 22. The transistor 16 has a source terminal coupled to the control node 22 and a drain terminal coupled to the ground reference node 20. The gate of the transistor 14 is coupled to receive a bias voltage (Vbiasp) generated by an appropriate bias voltage generator (not shown, but well known to those skilled in the art). The transistor 14 accordingly functions as a current source and the transistor 16 functions as a source follower.

A pair of series connected n-channel transistors 24 and 26 is coupled between the supply node 18 (configured to receive the relatively lower supply voltage VDD) and the ground reference node 20. The transistor 24 has a drain terminal coupled to the supply node 18 and a source terminal coupled to a control node 32. The transistor 26 has a drain terminal coupled to the control node 32 and a source terminal coupled to the ground reference node 20. The gate of the transistor 26 is coupled to receive a bias voltage (Vbiasn) generated by an appropriate bias voltage generator (not shown, but well known to those skilled in the art). The transistor 26 accordingly functions as a current source and the transistor 24 functions as a source follower.

An n-channel transistor 40 and p-channel transistor 42 are coupled in series between the input node 12 and an output node 44. The transistor 40 has a source terminal coupled to the input node and a drain terminal coupled to an intermediate node 46. The transistor 42 has a drain terminal coupled to an intermediate node 46 and a source terminal coupled to the output node 44. The gate of transistor 40 is coupled to the control node 22 and the gate of transistor 42 is coupled to the control node 32. The gate of transistor 16 is coupled to the intermediate node 46. The gate of transistor 24 is coupled to the output node 44.

The circuit comprised of transistors 14, 16 and 40 forms a first clipping circuit designed to clip positive voltages on the input signal received at input node 12. The first clipping circuit operates as follows: as the input signal IN increases in voltage, there is an increase in the gate voltage of transistor 16. The voltage at the control node 22 leads the voltage at the input node 12 by a threshold voltage Vt of the transistor 16. Saturation occurs as the voltage at the input node 12 approaches VDD. The stress across transistor 40 is accordingly managed and the input signal is clipped to produce an output signal OUT with a voltage no higher than VDD−Vt of the transistor 40.

The circuit comprised of transistors 24, 26 and 42 forms a second clipping circuit designed to clip negative voltages on the input signal propagated to intermediate node 46. The second clipping circuit operates as follows: as the input signal decreases in voltage, there is a decrease in the gate voltage of transistor 24. The voltage at the control node 32 follows the voltage at the output node 44 by a threshold voltage Vt of the transistor 24. Saturation occurs as the voltage at the output node 44 approaches 0V. The stress across transistor 42 is accordingly managed and the input signal is clipped to produce an output signal OUT with a voltage no lower than Vt of transistor 42.

The control nodes 22 and 32 vary with changes in the input signal IN within an input signal range of Vt to VDD−Vt. If the input signal exceeds VDD−Vt, the output signal is clamped to VDD−Vt. If the input signal is less than Vt, the output signal is clamped to Vt. The circuit 10 accordingly functions to control the signal (OUT) at the output node 44 in the range of Vt to VDD−Vt even though the input signal (IN) may range from a few negative volts to the relatively higher supply voltage (for example, 5V).

Circuits for other high voltage tolerant input buffers are well known in the art.

Many input tolerant buffer circuits, however, suffer from concerns over maintaining linearity of output characteristic over a specified common mode range while still providing for voltage clipping. There is a need in the art for a tolerant input buffer circuit that can address the foregoing and other problems.

SUMMARY

In an embodiment, a circuit comprises: an input node; a first input transistor having a gate terminal coupled to the input node, a source terminal and a drain terminal; a first voltage divider circuit coupled between the source terminal of the first input transistor and a first supply node, the first voltage divider circuit including a first tap node; a first plurality of series connected transistors including a first transistor and a second transistor, wherein a gate terminal of the first transistor is coupled to the source terminal of the first input transistor and a gate terminal of the second transistor is coupled to the first tap node; and an output node coupled to the source terminal of the first input transistor.

In an embodiment, a circuit comprises: an input node; a first input transistor having a gate terminal coupled to the input node, a source terminal and a drain terminal; a first voltage divider circuit coupled between the source terminal of the first input transistor and a first supply node, the first voltage divider circuit including a first tap node; a second input transistor having a gate terminal coupled to the input node, a source terminal and a drain terminal; a second voltage divider circuit coupled between the source terminal of the second input transistor and a second supply node, the second voltage divider circuit including a first tap node; a first plurality of series connected transistors including a first transistor and a second transistor, wherein a gate terminal of the first transistor is coupled to the source terminal of the first input transistor and a gate terminal of the second transistor is coupled to the first tap node; a second plurality of series connected transistors including a third transistor and a fourth transistor, wherein a gate terminal of the third transistor is coupled to the source terminal of the second input transistor and a gate terminal of the fourth transistor is coupled to the second tap node; and an output node coupled to the source terminals of the first and second input transistors.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
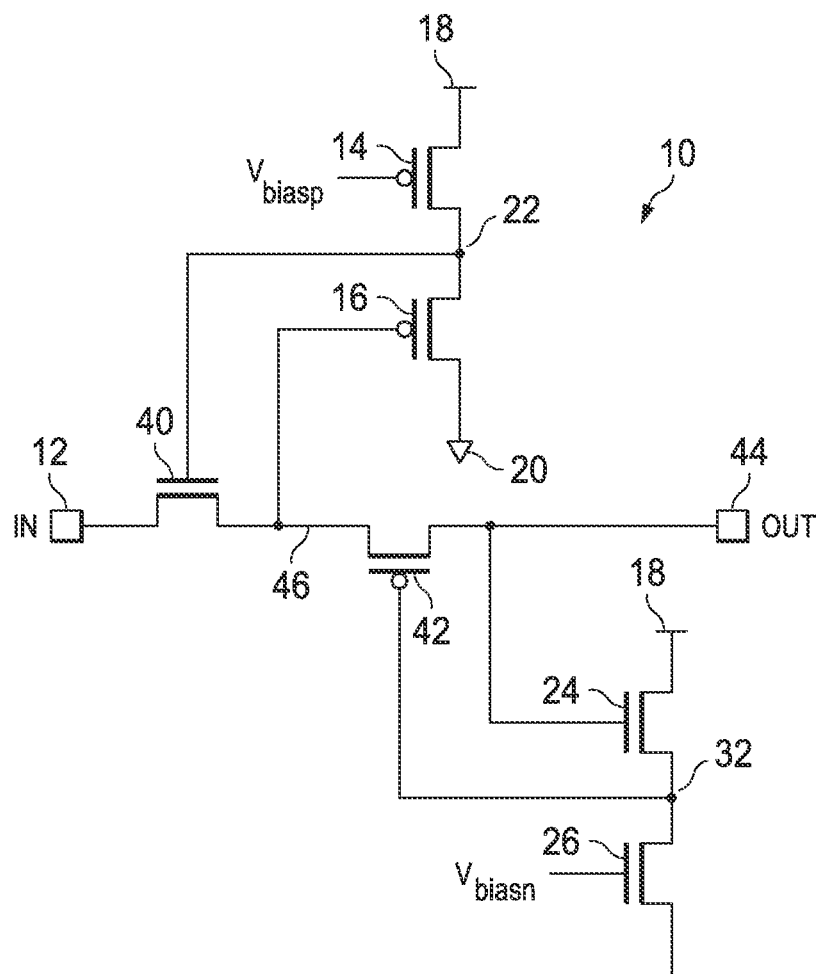
FIG. 1 is a circuit diagram of a prior art high voltage tolerant input buffer circuit.
Figure 2:
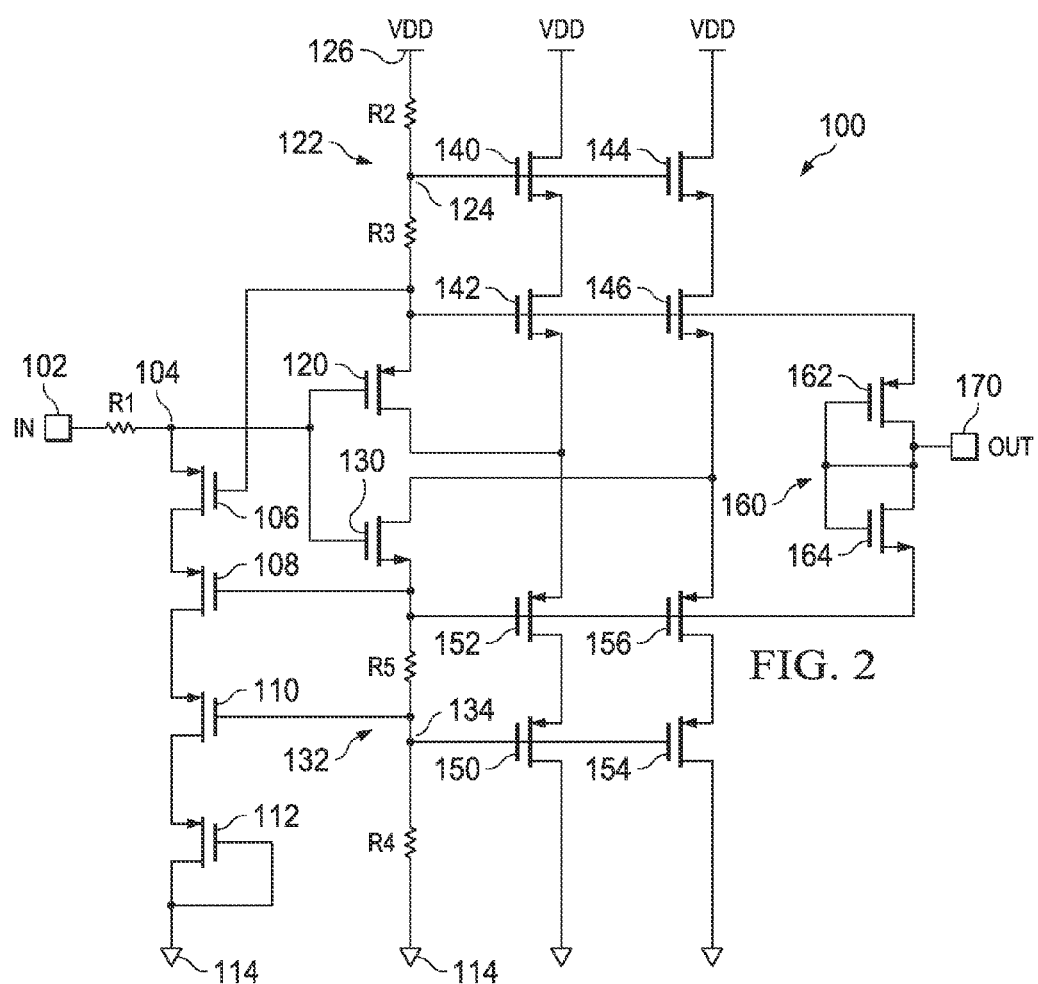
FIG. 2 is a circuit diagram of a high voltage tolerant input buffer circuit.

Reference is now made to FIG. 2 which illustrates a circuit diagram of a high voltage tolerant input buffer circuit 100. An input node 102 is configured to receive an input signal (IN) referenced to a relatively higher supply voltage. For example, the input signal may be referenced to a higher supply voltage of 5V, and may comprise a digital signal wherein the input signal is at 5V to represent a logic high data value and is at 0V to represent a logic low data value. The circuit 100, however, is powered from a relatively lower supply voltage (VDD). For example, the relatively lower supply voltage VDD may comprise 3.3V, 2.5V or 1.8V. The circuit 100 may accordingly form an input buffer circuit for an integrated circuit device powered from the relatively lower supply voltage VDD where the circuit functions to receive and tolerate input signals referenced to the higher supply voltage for translation to the relatively lower supply voltage.

A resistor R1 is coupled between the input node 102 and node 104.

A set of p-channel transistors 106, 108, 110 and 112 is coupled in series between the node 104 and a ground reference node 114. The transistor 106 has a source terminal coupled to the node 104. The transistor 108 has a source terminal coupled to a drain terminal of the transistor 104. The transistor 110 has a source terminal coupled to a drain terminal of the transistor 108. The transistor 112 has a source terminal coupled to a drain terminal of the transistor 110, a drain terminal coupled to the ground reference node 114 and a gate terminal coupled to the ground reference node 114. The series-connected source-drain paths of the set of p-channel transistors 106, 108, 110 and 112 form a current path to divert current when the voltage at the input node is significantly higher than the supply voltage VDD.

The circuit 100 further includes a p-channel source-follower transistor 120 having a gate terminal coupled to the node 104 to receive the input signal (IN). A voltage divider circuit 122 is coupled between a source terminal of the transistor 120 and a supply node 126 for the supply voltage VDD. The voltage divider circuit 122 is formed of series connected resistors R2 and R3 with a tap node 124.

The circuit 100 further includes an n-channel source-follower transistor 130 having a gate terminal coupled to the node 104 to receive the input signal (IN). A voltage divider circuit 132 is coupled between a source terminal of the transistor 130 and the ground reference node 114. The voltage divider circuit 132 is formed of series connected resistors R4 and R5 with a tap node 134.

The source terminal of transistor 120 is coupled to the gate terminal of transistor 106. The source terminal of transistor 130 is coupled to the gate terminal of transistor 108. The tap node 134 is coupled to the gate terminal of transistor 110. The ground reference node 114 is coupled to the gate terminal of transistor 112 (thus configuring transistor 112 as a diode-connected device). The set of p-channel transistors 106, 108, 110 and 112 are accordingly biased to function as a voltage suppression circuit and ensure that the voltage at node 104 does not exceed VDD+(device max rating−Vt) when the voltage of the input signal IN exceeds VDD.

A first pair of series connected n-channel transistors 140 and 142 is coupled between the supply node 126 (configured to receive the relatively lower supply voltage) and the drain terminal of the transistor 120. The transistor 140 has a drain terminal coupled to the supply node 126. The transistor 142 has a drain terminal coupled to a source terminal of the transistor 140 and a source terminal coupled to the drain terminal of the transistor 120. The gate of the transistor 140 is coupled to the tap node 124. The gate of transistor 142 is coupled to the source terminal of the transistor 120.

A second pair of series connected n-channel transistors 144 and 146 is coupled between the supply node 126 (configured to receive the relatively lower supply voltage) and the drain terminal of the transistor 130. The transistor 144 has a drain terminal coupled to the supply node 126. The transistor 146 has a drain terminal coupled to a source terminal of the transistor 144 and a source terminal coupled to the drain terminal of the transistor 130. The gate of the transistor 144 is coupled to the tap node 124. The gate of transistor 146 is coupled to the source terminal of the transistor 120.

A first pair of series connected p-channel transistors 150 and 152 is coupled between ground reference node 114 and the drain terminal of the transistor 120. The transistor 150 has a drain terminal coupled to the ground reference node 114. The transistor 152 has a drain terminal coupled to a source terminal of the transistor 150 and a source terminal coupled to the drain terminal of the transistor 120. The gate of the transistor 150 is coupled to the tap node 134. The gate of transistor 152 is coupled to the source terminal of the transistor 130.

A second pair of series connected p-channel transistors 154 and 156 is coupled between ground reference node 114 and the drain terminal of the transistor 130. The transistor 154 has a drain terminal coupled to the ground reference node 114. The transistor 156 has a drain terminal coupled to a source terminal of the transistor 154 and a source terminal coupled to the drain terminal of the transistor 130. The gate of the transistor 154 is coupled to the tap node 134. The gate of transistor 156 is coupled to the source terminal of the transistor 130.

A CMOS circuit 160 is coupled between the source terminal of the transistor 120 and the source terminal of the transistor 130. The circuit 160 comprises a p-channel transistor 162 having a source terminal coupled to the source terminal of the transistor 120 and an n-channel transistor 164 having a source terminal coupled to the source terminal of the transistor 130. The drain terminals of the transistors 162 and 164 are coupled together at the output node 170. The gate terminals of the transistors 162 and 164 are also coupled to the output node 170 (thus configuring transistors 152 and 164 as diode-connected devices).

The transistor 120 forms a source-follower circuit with resistors R2 and R3 and transistors 150 and 152.

The transistor 130 forms a source-follower circuit with resistors R4 and R5 and transistors 140 and 142.

The transistors 154 and 156 function, when the input signal transitions from low to high, to ensure that the drain terminal of transistor 130 is not floating and has a voltage moving in the direction of the input signal so as to control stress voltage.

The transistors 144 and 146 function, when the input signal transitions from high to low, to ensure that the drain terminal of transistor 120 is not floating and has a voltage moving in the direction of the input signal so as to control stress voltage.

The gates of transistors 140, 142, 144 and 146 move up and down with changes in the input signal IN. When the input signal has a lower voltage, the voltage at the gates of transistors 140 and 144 differs from the voltage at the gates of transistors 142 and 146 due to high current flow and the effect of the voltage divider formed by resistors R2 and R3. Conversely, when the input signal has a higher voltage, voltage at the gates of transistors 140, 142, 144 and 146 approaches the relatively lower supply voltage VDD and a highest voltage is passed to the drain terminals of transistors 123 and 130. At the same time, the voltage at the gates of transistors 150, 152, 154 and 156 rises, decreasing conductivity through transistors 150, 152, 154 and 156, and permitting the highest voltage output from the drain terminals of transistors 123 and 130.

The gates of transistors 150, 152, 154 and 156 move up and down with changes in the input signal IN. When the input signal has a higher voltage, the voltage at the gates of transistors 150 and 154 differs from the voltage at the gates of transistors 152 and 156 due to high current flow and the effect of the voltage divider formed by resistors R4 and R5. Conversely, when the input signal has a lower voltage, voltage at the gates of transistors 150, 152, 154 and 156 approaches the ground reference and a lowest voltage is passed to the drain terminals of transistors 120 and 130. At the same time, the voltage at the gates of transistors 140, 142, 144 and 146 falls, decreasing conductivity through transistors 140, 142, 144 and 146, and permitting the lowest voltage output from the drain terminals of transistors 120 and 130.

The circuit arrangement accordingly functions such that negligible current flows through the transistors 140-146 and transistors 150-156 when the input signal is at 0V or at VDD. Complete control over standby current is thus enabled (as determined by the resistances R2-R5, where R2=R4 and R3=R5).

The CMOS circuit 160 functions in a unity gain source follower mode to generate the output signal OUT. The circuit 160 creates an intermediate voltage by connecting and dividing the difference between the voltages generated at the sources of transistors 120 and 130. The output signal OUT accordingly has a voltage swing of Vtn to VDD−Vtp.

The dual source-follower circuit configuration functions to maintain signal linearity and clip the signal at voltages above the relatively lower supply voltage VDD. Any voltage of the input signal IN above the relatively lower supply voltage VDD will not appear at the output signal OUT. At the input node 102, any voltage above a certain value is suppressed by the circuitry of transistors 106, 108, 110 and 112.

The transistor 120 in source-follower configuration receives the input signal IN at its gate terminal. The source terminal of transistor 120 is accordingly at a voltage of Vin+Vtp. The transistor 130 in source-follower configuration receives the input signal IN at its gate terminal. The source terminal of transistor 130 is accordingly at a voltage of Vin−Vtn. This voltage behavior remains the same until the input signal IN reaches close to VDD or 0V. These source voltages, when interpolated through the circuit 160 to the output node 170, create an output signal OUT voltage which follows the input signal IN voltage but with voltage swing range of Vtn to VDD−Vtp. It will be noted that a preferred implementation provides for transistors 120 and 130 to be similarly sized (matched) to transistors 162 and 164 in order for an accurate voltage interpolation to be performed.

Figure 3:
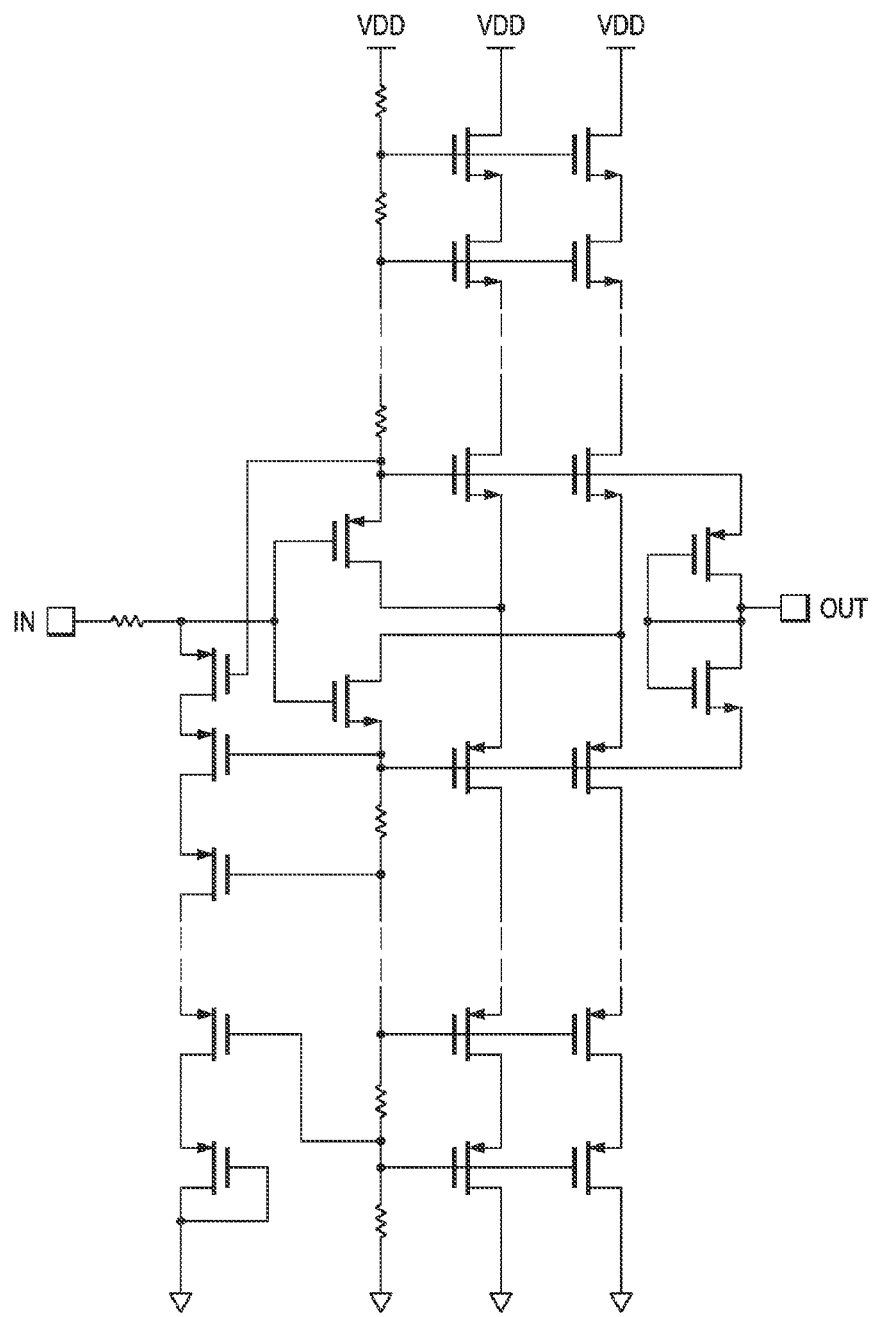
FIG. 3 is a circuit diagram of a scalable high voltage tolerant input buffer circuit.

Reference is now made to FIG. 3 which illustrates a circuit diagram of a scalable high voltage tolerant input buffer circuit. The circuit is similar to the circuit 100 of FIG. 2 except that it illustrates how the circuit configuration can be scaled with respect to the voltage divider circuitry series connected n-channel and p-channel transistors to accommodate a range of voltages for VDD. This scaling is made by increasing the number of resistors in each voltage divider and correspondingly increasing the number of transistors in each set of series connected transistor circuits.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
    an input node;
    a first input transistor having a gate terminal coupled to the input node, a source terminal and a drain terminal;
    a first voltage divider circuit having a first terminal directly connected to the source terminal of the first input transistor and a second terminal coupled to a first supply node, the first voltage divider circuit including a first tap node;
    a first plurality of series connected transistors including a first transistor and a second transistor, wherein a gate terminal of the first transistor is coupled to the source terminal of the first input transistor and a gate terminal of the second transistor is coupled to the first tap node; and
    an output node coupled to the source terminal of the first input transistor.

2. The circuit of claim 1, further comprising an output transistor having a source terminal coupled to the source terminal of the first input transistor and a drain terminal coupled to the output node.

3. The circuit of claim 1, wherein the first plurality of series connected transistors is coupled between the first supply node and the drain terminal of the first input transistor.

4. The circuit of claim 1, further comprising a second plurality of series connected transistors coupled between a second supply node and the drain terminal of the first input transistor.

5. The circuit of claim 1, further comprising:
    a second input transistor having a gate terminal coupled to the input node, a source terminal and a drain terminal;
    a second voltage divider circuit having a first terminal directly connected to the source terminal of the second input transistor and a second terminal coupled to a second supply node, the second voltage divider circuit including a second tap node; and
    a second plurality of series connected transistors including a third transistor and a fourth transistor, wherein a gate terminal of the third transistor is coupled to the source terminal of the second input transistor and a gate terminal of the fourth transistor is coupled to the second tap node;
    wherein the output node is further coupled to the source terminal of the second input transistor.

6. The circuit of claim 5, further comprising an output transistor having a source terminal coupled to the source terminal of the second input transistor and a drain terminal coupled to the output node.

7. The circuit of claim 6, wherein the output transistor is a diode-connected device.

8. The circuit of claim 5, wherein the second plurality of series connected transistors is coupled between the second supply node and the drain terminal of the second input transistor.

9. The circuit of claim 5, wherein the second plurality of series connected transistors is coupled between the second supply node and the drain terminal of the first input transistor.

10. The circuit of claim 5, wherein the first plurality of series connected transistors is coupled between the first supply node and the drain terminal of the second input transistor.

11. The circuit of claim 5, further including a plurality of transistors coupled in series between the gate terminal of the second input transistor and the second supply node, said plurality of transistors including one transistor having a gate terminal coupled to the source terminal of the first input transistor and another transistor having a gate terminal coupled to the source terminal of the second input transistor.

12. The circuit of claim 11, wherein said plurality of transistors further includes yet another transistor having a gate terminal coupled to the second tap node.

13. The circuit of claim 12, wherein said plurality of transistors further includes a diode-connected transistor.

14. A circuit, comprising:
an input node;
a first input transistor having a gate terminal coupled to the input node, a source terminal and a drain terminal;
a first voltage divider circuit coupled between the source terminal of the first input transistor and a first supply node, the first voltage divider circuit including a first tap node;
a first plurality of series connected transistors including a first transistor and a second transistor, wherein a gate terminal of the first transistor is coupled to the source terminal of the first input transistor and a gate terminal of the second transistor is coupled to the first tap node; and
an output node coupled to the source terminal of the first input transistor; and
an output transistor having a source terminal coupled to the source terminal of the first input transistor and a drain terminal coupled to the output node,
wherein the output transistor is a diode-connected device.

15. The circuit of claim 14, wherein the first plurality of series connected transistors is coupled between the first supply node and the drain terminal of the first input transistor.

16. The circuit of claim 14, further comprising a second plurality of series connected transistors coupled between a second supply node the drain terminal of the first input transistor.

17. The circuit of claim 14, further including:
a second input transistor having a gate terminal coupled to the input node, a source terminal and a drain terminal; and
a plurality of transistors coupled in series between the gate terminals of the first and second input transistors and a second supply node, said plurality of transistors including one transistor having a gate terminal coupled to the source terminal of the first input transistor and another transistor having a gate terminal coupled to the source terminal of the second input transistor.

18. The circuit of claim 17, further comprising:
a second voltage divider circuit coupled between the source terminal of the second input transistor and the second supply node, the second voltage divider circuit including a second tap node;
wherein said plurality of transistors further includes yet another transistor having a gate terminal coupled to the second tap node.

19. The circuit of claim 17, wherein said plurality of transistors further includes a diode-connected transistor.

20. A circuit, comprising:
an input node;
a first input transistor having a gate terminal coupled to the input node, a source terminal and a drain terminal;
a first voltage divider circuit coupled between the source terminal of the first input transistor and a first supply node, the first voltage divider circuit including a first tap node;
a first plurality of series connected transistors including a first transistor and a second transistor, wherein a gate terminal of the first transistor is coupled to the source terminal of the first input transistor and a gate terminal of the second transistor is coupled to the first tap node;
an output node coupled to the source terminal of the first input transistor; and
a plurality of transistors coupled in series between the gate terminal of the first input transistor and a second supply node, said plurality of transistors including one transistor having a gate terminal coupled to the source terminal of the first input transistor.

21. The circuit of claim 20, wherein said plurality of transistors further includes a diode-connected transistor.

22. The circuit of claim 20, further comprising:
a second input transistor having a gate terminal coupled to the input node, a source terminal and a drain terminal; and
wherein said plurality of transistors comprises another transistor having a gate terminal coupled to the source terminal of the second input transistor.

23. The circuit of claim 22, further comprising:
a second voltage divider circuit coupled between the source terminal of the second input transistor and the second supply node, the second voltage divider circuit including a second tap node;
wherein said plurality of transistors further includes yet another transistor having a gate terminal coupled to the second tap node.

24. A circuit, comprising:
an input node;
a first input transistor having a gate terminal coupled to the input node, a source terminal and a drain terminal;
a first voltage divider circuit coupled between the source terminal of the first input transistor and a first supply node, the first voltage divider circuit including a first tap node;
a second input transistor having a gate terminal coupled to the input node, a source terminal and a drain terminal;
a second voltage divider circuit coupled between the source terminal of the second input transistor and a second supply node, the second voltage divider circuit including a first tap node;
a first plurality of series connected transistors including a first transistor and a second transistor, wherein a gate terminal of the first transistor is coupled to the source terminal of the first input transistor and a gate terminal of the second transistor is coupled to the first tap node;
a second plurality of series connected transistors including a third transistor and a fourth transistor, wherein a gate terminal of the third transistor is coupled to the source terminal of the second input transistor and a gate terminal of the fourth transistor is coupled to the second tap node; and an output node coupled to the source terminals of the first and second input transistors.

25. The circuit of claim 24, wherein the first plurality of series connected transistors is coupled between the first supply node and the drain terminal of the first input transistor.

26. The circuit of claim 24, wherein the first plurality of series connected transistors is coupled between the first supply node and the drain terminal of the second input transistor.

27. The circuit of claim 24, wherein the second plurality of series connected transistors is coupled between the second supply node and the drain terminal of the first input transistor.

28. The circuit of claim 24, wherein the second plurality of series connected transistors is coupled between the second supply node and the drain terminal of the second input transistor.

* * * * *